US009459292B2

(12) United States Patent
Lopelli et al.

(10) Patent No.: US 9,459,292 B2
(45) Date of Patent: Oct. 4, 2016

(54) VCO GAIN ESTIMATION BY CAPACITIVE MEASUREMENT

(71) Applicant: QUALCOMM Incorporated, San Diego, CA (US)

(72) Inventors: Emanuele Lopelli, Irvine, CA (US); Charles Chang-I Wang, Irvine, CA (US); Salvatore Pennisi, Irvine, CA (US); Shervin Moloudi, Los Angeles, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 57 days.

(21) Appl. No.: 14/220,410

(22) Filed: Mar. 20, 2014

(65) Prior Publication Data

US 2015/0268279 A1 Sep. 24, 2015

(51) Int. Cl.
*H03B 5/12* (2006.01)
*G01R 19/00* (2006.01)
*H03L 7/00* (2006.01)
*H03B 1/00* (2006.01)
*H03B 5/08* (2006.01)
*H03L 7/085* (2006.01)
*H03L 7/099* (2006.01)

(52) U.S. Cl.
CPC .............. *G01R 19/0023* (2013.01); *H03B 1/00* (2013.01); *H03B 5/08* (2013.01); *H03L 7/00* (2013.01); *H03L 7/085* (2013.01); *H03L 7/099* (2013.01)

(58) Field of Classification Search
CPC ......... H03L 7/18; H03L 7/085; H03L 7/099; H03L 7/00; H03B 1/00; H03B 5/08; G01R 19/0023
USPC ....... 331/16, 17, 167, 117 FE, 117 R, 177 V, 331/183, 182, 175
See application file for complete search history.

(56) References Cited

U.S. PATENT DOCUMENTS

| 6,906,596 | B2 * | 6/2005 | Kitamura .................. H03L 5/00 327/156 |
| 7,053,727 | B2 | 5/2006 | Nilsson |
| 7,688,155 | B2 * | 3/2010 | Han et al. ................. 331/177 V |
| 7,692,500 | B1 | 4/2010 | Koukab et al. |
| 7,714,665 | B2 * | 5/2010 | Waheed .................. H03L 7/099 331/16 |
| 7,920,033 | B1 * | 4/2011 | Groe .................... H03C 3/0925 332/118 |
| 8,154,351 | B2 | 4/2012 | Tadjpour |
| 8,368,480 | B2 | 2/2013 | Wang |
| 2003/0090328 | A1 | 5/2003 | McDowell |
| 2004/0056725 | A1 * | 3/2004 | Kitamura et al. .......... 331/36 C |
| 2004/0212439 | A1 * | 10/2004 | Goddard ......................... 331/16 |
| 2006/0139106 | A1 | 6/2006 | Dosho et al. |
| 2007/0188255 | A1 | 8/2007 | Strandberg |

OTHER PUBLICATIONS

International Search Report and Written Opinion—PCT/US2015/017634—ISA/EPO—Jun. 2, 2015.

* cited by examiner

*Primary Examiner* — Arnold Kinkead
(74) *Attorney, Agent, or Firm* — Patterson & Sheridan, L.L.P.

(57) ABSTRACT

Aspects of the present disclosure are generally directed to techniques and apparatus for estimating a gain of a VCO in a PLL. In certain aspects, the technique includes calculating a C-V characteristic of a varactor matched to another varactor in the VCO. The technique also includes estimating the gain of the VCO based on the C-V characteristic of the varactor, a tank inductance of the VCO, and an output frequency of the VCO. Aspects of the present disclosure allow for estimating the gain of the VCO while the PLL remains in operation.

15 Claims, 3 Drawing Sheets

VCO GAIN ESTIMATION BY CAPACITIVE MEASUREMENT

BACKGROUND

1. Field

Certain aspects of the present disclosure generally relate to gain estimation of a voltage-controlled oscillator (VCO), and more specifically, to VCO gain estimation in a phase-locked loop (PLL) using an indirect capacitive measurement.

2. Background

There are several known methods to estimate the gain of a voltage-controlled oscillator (VCO) in a phase-locked loop (PLL). One is a counting-based method, and another is an injection method. Both methods entail the PLL being put offline. Both methods also involve substantial time to obtain good accuracy. Further, the counting-based method may include a high frequency measurement at the output of the VCO and the PLL to be open loop during the estimation process.

SUMMARY

The present disclosure provides apparatus, systems, methods, and computer programs for estimating a gain of a VCO.

In one embodiment, an apparatus for estimating a gain of a VCO in a PLL is disclosed. The apparatus generally includes: means for matching to a varactor in the VCO; and means for estimating the gain of the VCO by calculating a C-V characteristic of the means for matching along with tank inductance and an output frequency of the VCO, wherein estimating the gain of the VCO by calculating the C-V characteristic of the means for matching allows the PLL to remain in operation during estimation.

In another embodiment, a phase-locked loop (PLL) system is disclosed. The system generally includes: a voltage-controlled oscillator (VCO) including a first varactor, the VCO configured to generate a signal with an output frequency based on a control voltage, wherein a gain of the VCO is defined as change in the output frequency per change in the control voltage; a phase-frequency detector configured to receive and compare the signal fed back through a feedback loop with a reference frequency signal, the phase-frequency detector operating to output an up or down signal based on whether the output frequency leads or lags the reference frequency signal; a loop filter configured to accumulate the up or down signal to generate the control voltage for the VCO; a VCO gain estimation unit including a second varactor matched to the first varactor, the VCO gain estimation unit configured to estimate the gain of the VCO using a C-V characteristic of the second varactor along with tank inductance of the VCO and the output frequency, wherein the configuration of the VCO gain estimation unit enables the PLL system to remain in operation during the estimation process.

In another embodiment, a method of estimating a gain of a VCO in a PLL is disclosed. The method generally includes: providing a matched unit that matches a varactor in the VCO; and estimating the gain of the VCO by calculating a C-V characteristic of the matched unit along with tank inductance and an output frequency of the VCO, wherein estimating the gain of the VCO by calculating the C-V characteristic of the matched unit allows the PLL to remain in operation during estimation.

In yet another embodiment, a non-transitory storage medium storing a computer program to estimate a gain of a VCO in a PLL is disclosed. The computer program generally includes executable instructions that cause a computer to: generate a simulated circuit that matches a varactor of the VCO; and estimate the gain of the VCO by calculating a C-V characteristic of the simulated circuit and combining it with tank inductance and an output frequency of the VCO, wherein estimating the gain of the VCO by calculating the C-V characteristic of the simulated circuit allows the PLL to remain in operation during estimation.

Other features and advantages of the present invention should be apparent from the description which illustrates, by way of example, various aspects of the invention.

BRIEF DESCRIPTION OF THE DRAWINGS

The details of certain aspects of the present disclosure, both as to structure and operation, may be gleaned in part by study of the appended further drawings, in which like reference numerals refer to like parts, and in which.

DETAILED DESCRIPTION

Figure 1A:
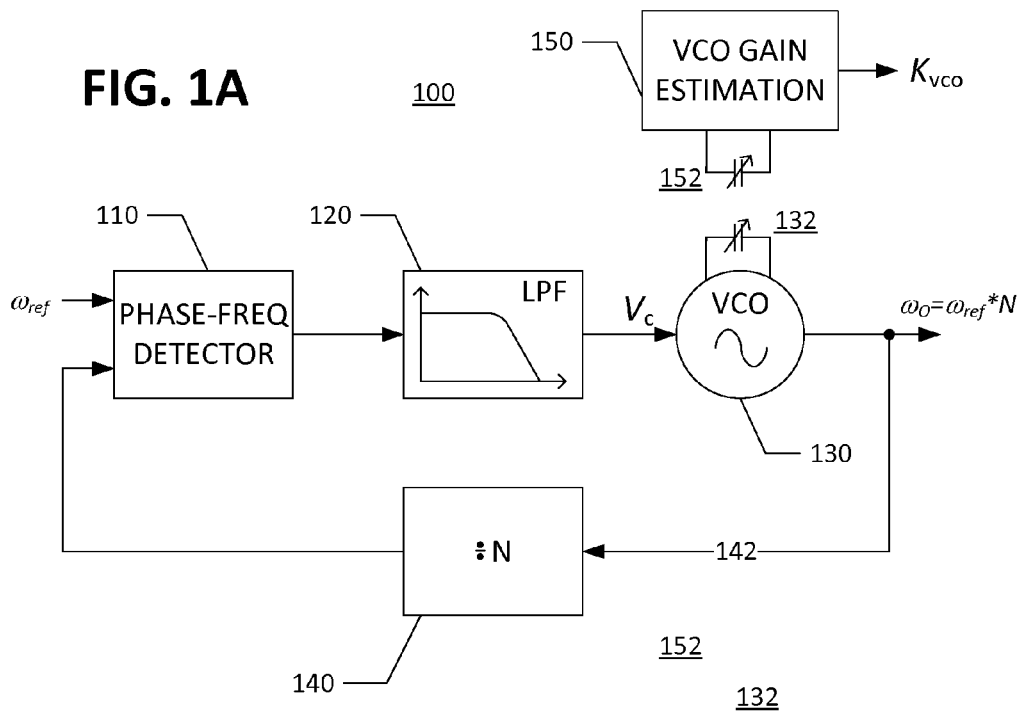
FIG. 1A is a functional block diagram illustrating a phase-locked loop (PLL) system in accordance with one embodiment of the present invention.

As described above, several inefficiencies exist with the conventional method of measuring the gain of a voltage-controlled oscillator (VCO), including requiring the phase-locked loop (PLL) to be put offline and requiring substantial time to obtain good accuracy. Certain embodiments as described herein provide for estimating the gain of a VCO by measuring the C-V characteristic of a varactor matched to a varactor in the VCO which allows the PLL to remain in operation during estimation. After reading this description it will become apparent how to implement the invention in various implementations and applications. Although various implementations of the present invention will be described herein, it is understood that these implementations are presented by way of example only, and not limitation. As such, this detailed description of various implementations should not be construed to limit the scope or breadth of the present invention.

In one embodiment, the gain of the VCO may be estimated by measuring the C-V characteristic of a separate, matched varactor under a large-signal condition. With this estimation process, the PLL may remain in operation during estimation. A separate circuit containing a matched (scaled or not scaled) copy of the varactor may be used to estimate the C-V characteristic. Thus, parameters for this estimation process may include tank inductance, oscillation amplitude, and a DC-quiescent point of an oscillator. The tank inductance may be an inductance (L) value of an oscillator. The oscillation amplitude may be detected using a simple peak detector. The DC-quiescent point is equivalent to the inductor center tap voltage.

In the estimation process, stepped, periodic signals may be generated and applied to an estimation circuit including a matched varactor. Thus, the periodic signals may be generated in incremental steps (e.g., N-points of a sine, N being a power of two for FFT purposes). The term "periodic" is used here to refer to any curve that describes a repetitive signal.

In one embodiment, the capacitance of the varactor may be calculated using a switched capacitor circuit. In other embodiments, the varactor capacitance may be calculated using other implementations. Once the varactor capacitances for all N-points have been collected, a harmonic analysis of the N-points may be performed. In one embodiment, an FFT analysis of the N-points may be calculated. Using the calculated harmonics, an effective capacitance, which is the capacitance under large signal conditions, may be calculated for a given control voltage. In one embodiment, the effective capacitance may be computed to be a sum of the DC coefficient and half of the second harmonic coefficient. Once the effective capacitance is calculated for a given control voltage, the process may move onto the next control voltage, and the process may be repeated for every voltage of a set of control voltages. Thus, the process may generate an effective C-V characteristic of the varactor which shows the characteristic relationship between the effective capacitance and the control voltage. The VCO gain ($K_{VCO}$) may then be computed using the effective C-V characteristic, the oscillation frequency ($\omega_0$), and the tank inductance L. In one embodiment, the $K_{VCO}$ may be computed as follows:

$$K_{VCO} = (\partial \omega_o / \partial V_c) = 0.5 * \omega_o^3 * L * (\partial C_{eff} / \partial V_c). \quad (1)$$

FIG. 1A is a functional block diagram illustrating a phase-locked loop (PLL) system 100 in accordance with one embodiment of the present invention. In the illustrated embodiment of FIG. 1A, the PLL system 100 includes a phase-frequency detector 110, a loop filter 120, a voltage-controlled oscillator (VCO) 130, and a VCO gain estimation unit 150. The PLL system 100 may also include a frequency divider 140 situated in the feedback loop 142 from the output of the VCO 130 to the input of the phase-frequency detector 110. The VCO 130 may generate a signal with an output frequency ($\omega_o$) based on the input control voltage ($V_c$). As described above, the VCO 130 may be characterized by a gain (i.e., $K_{VCO}$) that is defined as the change in output frequency ($\omega_o$) per change in input control voltage ($V_c$). Thus, $K_{VCO}$ may be defined as $\Delta\omega_o/\Delta V_c$. The VCO 130 may be adjustable, and may include one or more adjustable resistors, capacitors, inductors, or other elements which may be adjusted to control the VCO 130 to oscillate at a particular frequency for a given control voltage.

In the feedback loop 142, the output frequency ($\omega_o$) of the VCO 130 may be divided by the frequency divider 140 (e.g., divide by N) to produce an input signal for the phase-frequency detector 110. The phase-frequency detector 110 may receive the output of the frequency divider 140 and a reference frequency signal ($\omega_{ref}$), and may generate an output signal based on a phase difference between its two input signals. For example, an up signal or a down signal may be output by the phase-frequency detector 110 based on whether the divided frequency signal leads or lags the reference frequency signal, which may indicate a difference in phase/frequency between these two signals.

The loop filter 120 may act as a low pass filter to integrate or accumulate the up or down signals to generate a control voltage $V_c$, which may indicate an amount that the divided frequency signal leads or lags the reference frequency signal. The control voltage V, may then control or adjust the output frequency ($\omega_o$) of the VCO 130. Thus, the PLL system 100 may operate to drive the output frequency ($\omega_o$) of the VCO 130 to a frequency based on the reference frequency signal ($\omega_{ref}$) scaled by the scaling factor N of the frequency divider 140, which results in $\omega_o = \omega_{ref} * N$.

The VCO gain estimation unit 150 may be configured to estimate the gain of the VCO (i.e., $K_{VCO}$) by measuring the C-V characteristic of a varactor 152 in the unit 150 but matched to the varactor 132 in the VCO 130. As stated above, in this configuration, the PLL may remain in operation during the estimation process.

Figure 1B:
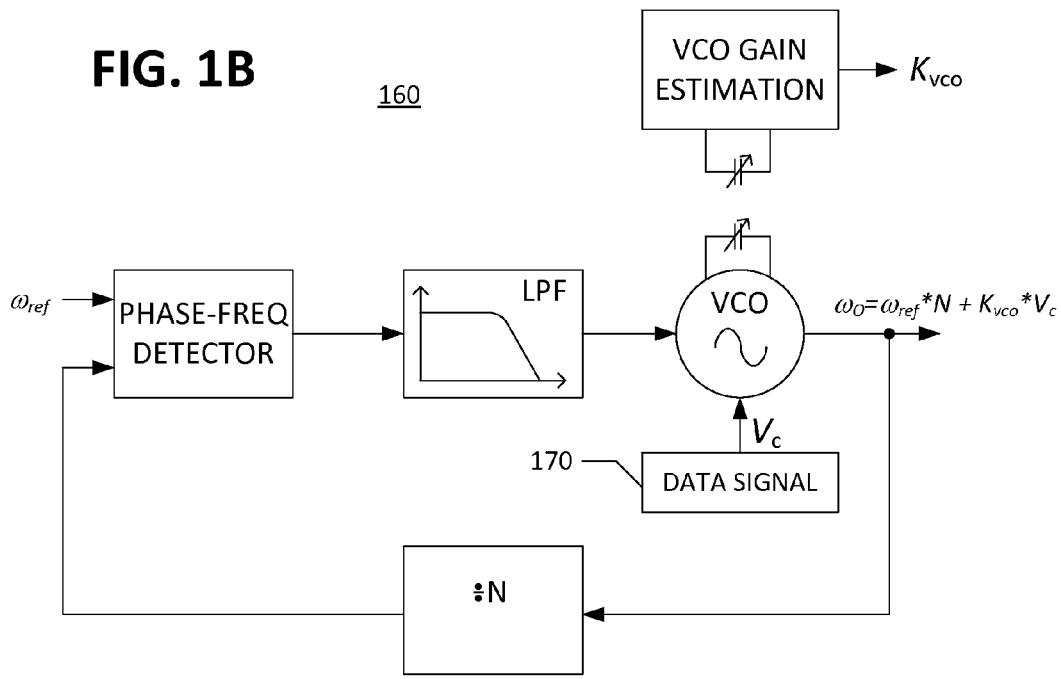
FIG. 1B is a functional block diagram illustrating a phase-locked loop (PLL) system in accordance with another embodiment of the present invention as used in a polar transmitter.

FIG. 1B is a functional block diagram illustrating a phase-locked loop (PLL) system 160 in accordance with another embodiment of the present invention as used in a polar transmitter. In the illustrated implementation of FIG. 1B, units used in the PLL 160 for the polar transmitter may be substantially similar to those used in the PLL 100 for other systems. One difference may be that the control voltage for the VCO is separately generated by a data signal unit 170.

Figure 2:
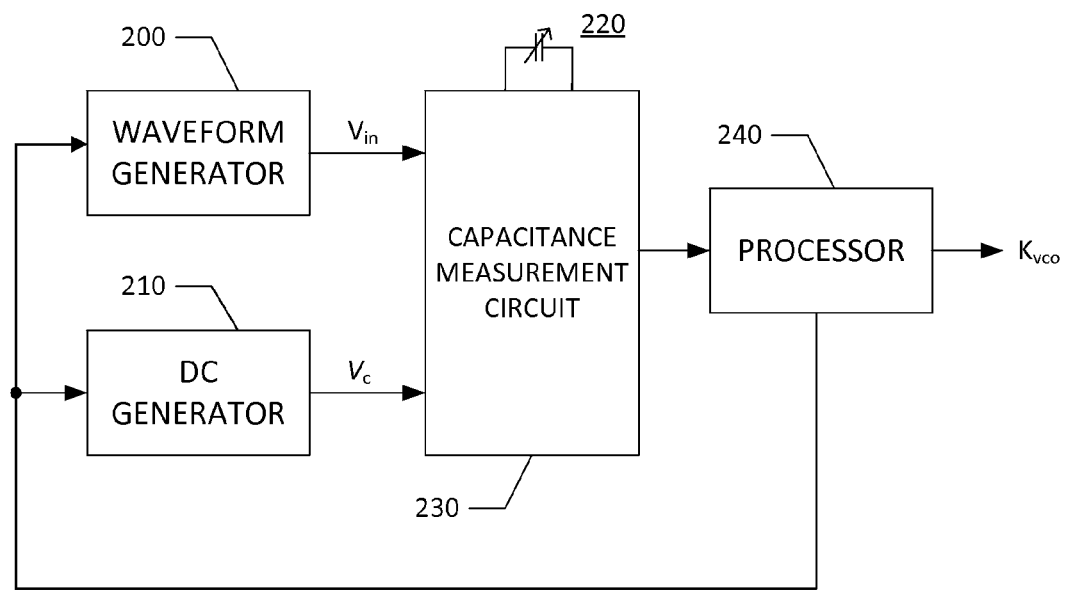
FIG. 2 is a detailed functional block diagram of the VCO gain estimation unit in accordance with one embodiment of the present invention.

FIG. 2 is a detailed functional block diagram of the VCO gain estimation unit 150 in accordance with one embodiment of the present invention. In the illustrated embodiment of FIG. 2, the VCO gain estimation unit 150 includes a waveform generator 200, a DC generator 210, a varactor 220, a capacitive measurement unit 230, and a processor 240. In one embodiment, the processor 240 may cause the waveform generator 200 to generate and apply a stepped, periodic signal ($V_{in}$) to an estimation circuit 220, 230 including the varactor 220. The stepped, periodic signal may be generated in incremental steps (e.g., N-points of a sine signal). The DC voltage of $V_{in}$ may be the DC quiescent point at the output of the VCO, and the amplitude of $V_{in}$ may be the amplitude of the waveform at the output of the VCO, which, in one embodiment, is the amplitude measured by the peak detector. Further, the DC generator 210 may generate $V_c$ for the capacitance measurement circuit 230. Once $V_{in}$ is applied to the varactor 220, the capacitive measurement unit 230 may measure the capacitive voltage across the varactor 220 for that specific $V_c$. In one embodiment, the capacitive voltage may be converted from an analog to a digital domain to generate an output voltage of the estimation unit 150. The capacitance of the varactor 220 may then computed by the processor 240.

In the VCO gain estimation unit 150 of FIG. 2, once the varactor capacitance for at least one period of the periodic signal has been collected, the processor 240 may perform a harmonic or spectral analysis of the N-points. In one embodiment, a fast-Fourier transform (FFT) of the N-points may be calculated. Using the calculated harmonics, an effective capacitance ($C_{eff}$), which is the capacitance under large signal conditions, may be calculated by the processor 240 for a given control voltage ($V_c$). In one embodiment, the effective capacitance may be computed to be the sum of the DC coefficient ($C_0$) and half of the second harmonic coefficient ($C_2$). Once the effective capacitance is calculated for a given control voltage, the process may move onto the next control voltage, and the process may be repeated for every control voltage. Thus, the process may generate an effective C-V characteristic of the varactor which shows the characteristic relationship between the effective capacitance and the control voltage. The VCO gain ($K_{VCO}$) may then be computed by the processor 240 using the effective C-V characteristic, the oscillation frequency ($\omega_0$), and the tank inductance L, as shown in Equation (1) above.

Figure 3:
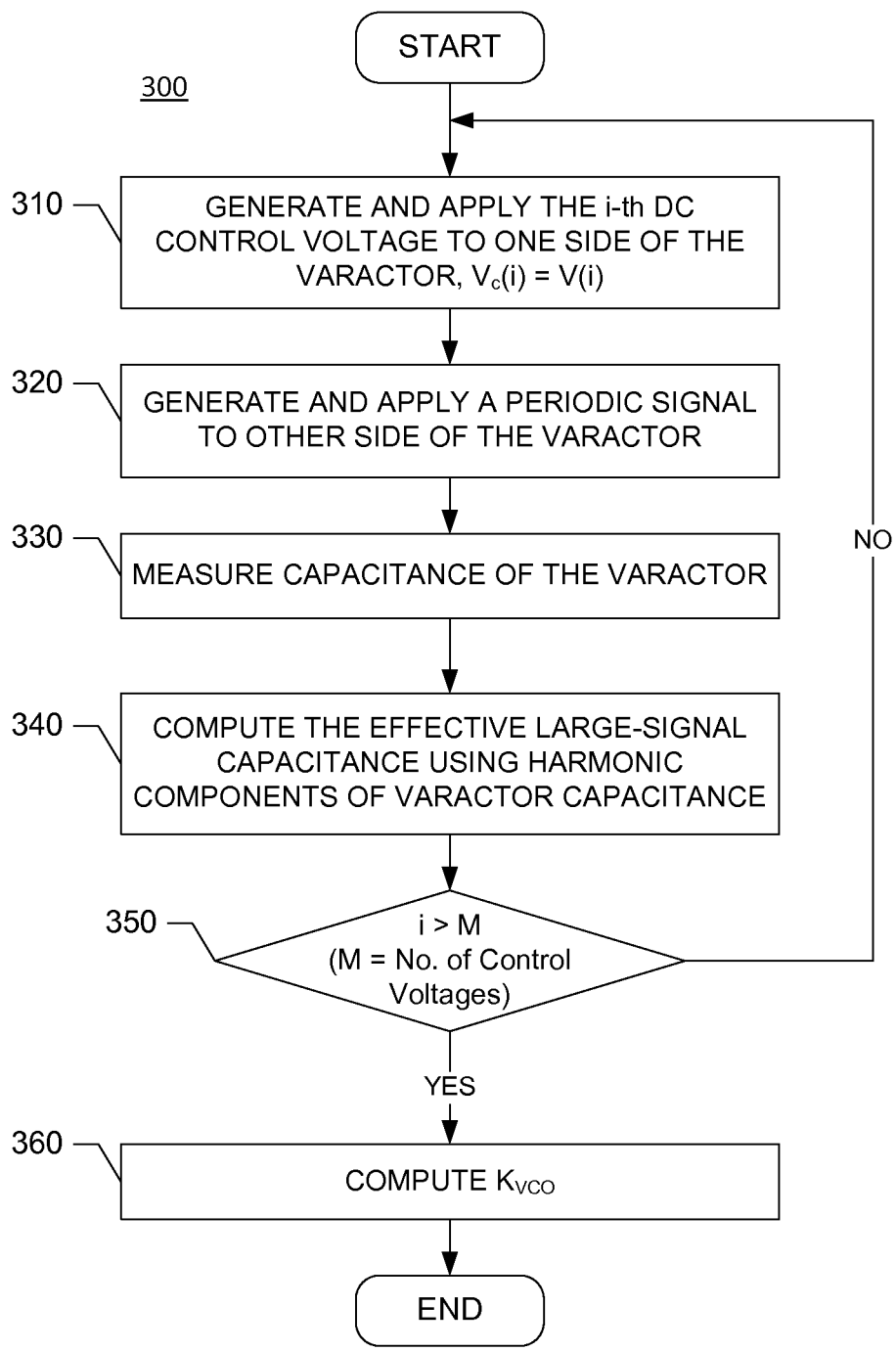
FIG. 3 is a functional flow diagram for calculating/estimating the VCO gain in a PLL in accordance with one embodiment of the present invention.

FIG. 3 is a functional flow diagram 300 of a process for estimating the VCO gain in a PLL in accordance with an embodiment of the present invention. In one embodiment, the process is carried out by the VCO gain estimation unit 150 depicted in FIG. 2. The initial control voltage ($V_c(i)$) may be generated by the processor 240, and may be applied to one side of the varactor, at step 310. A periodic signal may be generated and applied, at step 320, to the other side of the varactor, and the capacitance of the varactor may be measured, at step 330. The effective large-signal capacitance may then be computed, at step 340, using the harmonic components of the varactor capacitance. As stated above, the processor 240 may perform a harmonic or spectral analysis of the N-points. In one embodiment, a fast-Fourier transform (FFT) of the N-points is calculated. Using the calculated harmonics, an effective capacitance ($C_{eff}$), which is the capacitance under large signal conditions, may be calculated by the processor 240 for a given control voltage ($V_c$). In one embodiment, the effective capacitance is computed to be the sum of the DC coefficient ($C_0$) and half of the second harmonic coefficient ($C_2$).

The illustrated embodiment of FIG. 3 may use M number of the control voltages to estimate the VCO gain. Once the effective capacitance is calculated for a given control voltage, the process may move onto the next control voltage, and the process may be repeated for every control voltage. Thus, at step 350, a determination may be made whether all M number of control voltages have been used. If not all M number of control voltages have been used, the flow may return to step 310. Otherwise, if it is determined that all M number of control voltages have been used, the estimated VCO gain ($K_{vco}$) may be calculated, at step 360, by the processor 240 using the effective C-V characteristic, the oscillation frequency ($\omega_0$), and the tank inductance L, as shown in Equation (1) above.

For certain aspects, the VCO gain ($K_{vco}$) may vary over frequency, and better controlled VCO gain may be desired. Conventionally, multiple varactors biased at different points are used to flatten the VCO gain characteristic. However, since the VCO gain estimation process described in FIG. 3 allows for pre-distorting the gain data in the digital domain, multiple varactors need not be used.

Advantages of the above-described estimation process may include: (1) enabling the PLL to remain in operation during the estimation process; (2) running the estimation circuit as fast as desired by clocking at higher speed or by replicating the hardware to meet the specifications; (3) not requiring the circuits to handle the high frequency at the VCO output; (4) keeping the estimation process independent of the PLL dynamics (such as the loop bandwidth); and (5) the absence of the need for multiple varactors to flatten the $K_{VCO}$ characteristic because the method allows pre-distortion of the data in the digital domain.

Regarding the speed of the estimation circuit, the conventional methods, such as the counting method, may take 40 ms/point, while the injection method may entail a long time in a narrowband PLL due to large time constant dynamics. However, the above-described estimation process may be much faster and may take, for example, less than 4 μs/point. Further, digital pre-distortion may be applied to flatten the $K_{VCO}$ curve to save area and ease porting into later technology nodes.

Although several embodiments of the invention are described above, many variations of the invention are possible. For example, although the illustrated embodiments appear to suggest using the estimated VCO gain to optimize the VCO itself, the estimated VCO gain may be shipped to other blocks for further processing. For example, the VCO gain may be used in polar transmitters using two-point modulation PLL to reduce the used power and area compared to the classical I-Q architecture. In another example, the VCO gain may be used in any PLL system to reduce the variation of the PLL bandwidth, noise and dynamics due to a process spread. Further, features of the various embodiments may be combined in combinations that differ from those described above. Moreover, for clear and brief description, many descriptions of the systems and methods have been simplified. Many descriptions use terminology and structures of specific standards. However, the disclosed systems and methods are more broadly applicable.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the invention. In addition, the grouping of functions within a module, block, or step is for ease of description. Specific functions or steps can be moved from one module or block without departing from the invention.

The various illustrative logical blocks, units, steps, components, and modules described in connection with the embodiments disclosed herein can be implemented or performed with a processor, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Further, circuits implementing the embodiments and functional blocks and modules described herein can be realized using various transistor types, logic families, and design methodologies.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent presently preferred embodiments of the invention and are therefore representative of the subject matter which is broadly contemplated by the present invention. It is further understood that the scope of the present invention fully encompasses other embodiments that may become obvious to those skilled in the art and that the scope of the present invention is accordingly limited by nothing other than the appended claims.

What is claimed is:

1. An apparatus for estimating a gain of a VCO in a PLL, the apparatus comprising:

means for calculating a C-V characteristic of a varactor matched to another varactor in the VCO, wherein the means for calculating the C-V characteristic of the matched varactor comprises a means for applying a set of control voltages to the matched varactor;

means for estimating the gain of the VCO based on the C-V characteristic of the matched varactor, tank inductance of the VCO, and an output frequency of the VCO, wherein estimating the gain of the VCO based on the C-V characteristic of the matched varactor allows the PLL to remain in operation during estimation, wherein the C-V characteristic is calculated using a DC coefficient and a second harmonic coefficient of a fast-Fourier transform (FFT) analysis; and means for computing an effective capacitance across the matched varactor to be a sum of the DC coefficient and half of the second harmonic coefficient.

2. The apparatus of claim 1, further comprising:
means for generating and applying N-points of a stepped, periodic signal to the matched varactor; and
means for performing a harmonic analysis of the N-points to compute the C-V characteristic of the matched varactor.

3. The apparatus of claim 2, wherein the means for performing a harmonic analysis of the N-points comprises a capacitive measurement unit.

4. The apparatus of claim 3, wherein the capacitive measurement unit includes an amplifier and a switched capacitor circuit in a feedback loop around the amplifier.

5. A phase-locked loop (PLL) system, comprising:
a voltage-controlled oscillator (VCO) including a first varactor, the VCO configured to generate a signal with an output frequency based on a control voltage, wherein a gain of the VCO is defined as change in the output frequency per change in the control voltage;
a phase-frequency detector configured to receive and compare the signal fed back through a feedback loop with a reference frequency signal, the phase-frequency detector operating to output an up or down signal based on whether the output frequency leads or lags the reference frequency signal;
a loop filter configured to accumulate the up or down signal to generate the control voltage for the VCO; and
a VCO gain estimation unit including a second varactor matched to the first varactor, the VCO gain estimation unit configured to estimate the gain of the VCO using a C-V characteristic of the matched second varactor along with tank inductance of the VCO and the output frequency, wherein the VCO gain estimation unit is configured to calculate the C-V characteristic by applying a set of control voltages to the matched second varactor, wherein configuration of the VCO gain estimation unit enables the PLL system to remain in operation during estimation, wherein the C-V characteristic is calculated using a DC coefficient and a second harmonic coefficient of a fast-Fourier transform (FFT) analysis, and wherein the VCO gain estimation unit is configured to compute an effective capacitance across the matched second varactor to be a sum of the DC coefficient and half of the second harmonic coefficient.

6. The system of claim 5, wherein the VCO gain estimation unit further comprises:
a waveform generator configured to generate and apply N-points of a stepped, periodic signal to the matched second varactor; and
a capacitive measurement unit configured to perform a harmonic analysis of the N-points to compute the C-V characteristic of the matched second varactor.

7. The system of claim 6, wherein the harmonic analysis comprises a fast-Fourier transform (FFT) analysis.

8. The system of claim 5, further comprising a frequency divider in the feedback loop configured to divide the output frequency of the VCO by a scaling factor N.

9. A method of estimating a gain of a VCO in a PLL, the method comprising:
calculating a C-V characteristic of a matched unit that matches a varactor in the VCO, wherein calculating the C-V characteristic of the matched unit comprises applying a set of control voltages to the matched unit; and
estimating the gain of the VCO based on the C-V characteristic of the matched unit, tank inductance of the VCO, and an output frequency of the VCO, wherein estimating the gain of the VCO based on the C-V characteristic of the matched unit allows the PLL to remain in operation during estimation, wherein the C-V characteristic is calculated using a DC coefficient and a second harmonic coefficient of a fast-Fourier transform (FFT) analysis; and
computing effective capacitance across the matched unit to be a sum of the DC coefficient and half of the second harmonic coefficient.

10. The method of claim 9, further comprising, for each control voltage of the set of control voltages:
generating and applying N-points of a stepped, periodic signal to the matched unit; and
performing a harmonic analysis of the N-points to compute the C-V characteristic of the matched unit.

11. The method of claim 10, wherein the matched unit is a matched varactor, and wherein performing a harmonic analysis includes:
measuring effective capacitance across the matched unit.

12. The method of claim 10, wherein performing a harmonic analysis comprises performing a fast-Fourier transform (FFT) analysis.

13. A non-transitory computer-readable storage medium storing a computer program to estimate a gain of a VCO in a PLL, the computer program comprising executable instructions that cause a computer to:
generate a simulated circuit that matches a varactor of the VCO;
calculate a C-V characteristic of the simulated circuit, wherein calculating the C-V characteristic of the simulated circuit comprises applying a set of control voltages to the simulated circuit;
estimate the gain of the VCO based on the C-V characteristic of the simulated circuit, inductance of the VCO, and an output frequency of the VCO, wherein estimating the gain of the VCO based on the C-V characteristic of the simulated circuit allows the PLL to remain in operation during estimation, wherein the C-V characteristic is calculated using a DC coefficient and a second harmonic coefficient of a fast-Fourier transform (FFT) analysis; and
compute effective capacitance across the simulated circuit to be a sum of the DC coefficient and half of the second harmonic coefficient.

14. The non-transitory computer-readable storage medium of claim 13, further comprising executable instructions that cause the computer to:
generate and apply N-points of a stepped, periodic signal to the simulated circuit; and
perform a harmonic analysis of the N-points to compute the C-V characteristic of the simulated circuit.

15. The non-transitory computer-readable storage medium of claim 13, further comprising executable instructions that cause the computer to:

pre-distort the C-V characteristic in the digital domain to stabilize the VCO gain.

* * * * *